United States Patent [19]

Endo

[11] 4,292,728

[45] Oct. 6, 1981

[54] METHOD FOR MANUFACTURING SEMICONDUCTOR INTEGRATED CIRCUITS UTILIZING SPECIAL CONTACT FORMATION

[75] Inventor: Norio Endo, Yokohama, Japan

[73] Assignee: Tokyo Shibaura Denki Kabushiki Kaisha, Kawasaki, Japan

[21] Appl. No.: 48,090

[22] Filed: Jun. 13, 1979

[30] Foreign Application Priority Data

Jun. 13, 1978 [JP] Japan ................... 53-71088

[51] Int. Cl.³ .................. H01L 21/283; H01L 21/31
[52] U.S. Cl. ..................................... 29/571; 29/578; 148/187; 156/653; 156/656; 156/662; 357/23; 357/65; 357/68
[58] Field of Search ................ 29/571, 578; 148/187; 156/653, 656, 662; 357/23, 65, 68

[56] References Cited

U.S. PATENT DOCUMENTS

| | | | |
|---|---|---|---|
| 3,887,993 | 6/1975 | Okada et al. ........................... | 29/571 |
| 4,033,797 | 7/1977 | Dill et al. .............................. | 148/187 |
| 4,149,307 | 4/1979 | Henderson ............................. | 29/571 |
| 4,178,605 | 12/1979 | Hsu et al. ........................... | 357/23 X |
| 4,212,684 | 7/1980 | Brower ............................. | 148/187 X |
| 4,221,045 | 9/1980 | Godejahn ............................. | 29/571 |
| 4,224,733 | 9/1980 | Spadea ............................. | 29/578 X |

FOREIGN PATENT DOCUMENTS

| | | |
|---|---|---|
| 49-60468 | 6/1974 | Japan . |
| 49-60469 | 6/1974 | Japan . |
| 49-60470 | 6/1974 | Japan . |
| 49-135563 | 12/1974 | Japan . |
| 52-9341 | 1/1977 | Japan . |

*Primary Examiner*—L. Dewayne Rutledge
*Assistant Examiner*—W. G. Saba
*Attorney, Agent, or Firm*—Oblon, Fisher, Spivak, McClelland & Maier

[57] ABSTRACT

A method for manufacturing semiconductor integrated circuits such as metal oxide semiconductor field effect transistors having source and drain regions to which contact holes are made such that not only the contact parts of the source and the drain regions, but also both surface parts of a field oxide layer which are adjacent to the outer edges of source and drain regions, are exposed and contacted.

6 Claims, 6 Drawing Figures

METHOD FOR MANUFACTURING SEMICONDUCTOR INTEGRATED CIRCUITS UTILIZING SPECIAL CONTACT FORMATION

BACKGROUND OF THE INVENTION

1. Field of the Invention

This invention relates to the method of manufacturing semiconductor integrated circuits and more particularly to an improved method for making contact holes to semiconductor integrated circuit devices which contain a plurality of field effect transistors.

2. Description of the Prior Art

Semiconductor devices such as, for example, conventional silicon gate MOS transistor as shown in FIG. 1 are manufactured by forming on the surface of P-type Silicon substrate 1 a relatively thick field oxide layer 2. A predetermined part of this field oxide layer 2 is removed and in this removed portion field effect transistors are formed. In this example, by using gate 4 and the field oxide layer 2 as a mask, impurities such as phosphorus are diffused to the P-type silicon substrate, thereby forming n+ regions 5 and 6 which serve as source and drain, respectively. Gate 4 is formed of polysilicon material, and when forming polysilicon gate electrode 4 also polysilicon metallization 7 is formed. After making the necessary field effect transistors on the total surface of the device, a CVD oxide layer 8 is deposited. Thereafter, a contact hole is formed. The area of this contact hole W is normally w×w (w=5 to 6 μm). By using recent techniques w can be reduced to 4 μm, but to be practical from a reliability point of view, it is important that tolerances be provided. Firstly, because the field oxide 2 serves as a mask for subsequent n+ diffusion, to avoid the electrical short circuit of the electrode 9 or 10 and the p-type substrate 1 tolerance s as denoted in FIG. 1, which is normally chosen on the order of 2 μm, is provided. This value 2 μm is defined in consideration of the side etching and the precision of mask alignment. Then, in relation to the polysilicon gate electrode 4, the tolerance r is needed to avoid the electrical short circuit of aluminum metallization 9 and polysilicon gate electrode 4. Tolerance r is practically chosen on the order of 3 to 4 μm. Tolerance should be also considered as for the polysilicon metallization 7. That is, when the contact holes or the opening is made extending the edge of the polysilicon metallization 7 and the surface of the field oxide 2 is revealed. Then the underpart of the edge of the polysilicon metallization 7 is etched resulting in the formation of so-called overhang of the metallization 7. This overhang will result in the cutting of the metallization. To avoid this, it is also needed to provide a tolerance t on the order of 2 μm.

The above mentioned tolerances are primary factors limiting reductions in chip size of large-scaled semiconductor integrated circuits.

SUMMARY OF THE INVENTION

Accordingly, one object of this invention is to provide a new and improved method for manufacturing semiconductor integrated circuits which contain a plurality of field effect transistors.

Another object of the invention is to provide an improved method for manufacturing semiconductor integrated circuits and especially an improved method for forming contact holes to field effect transistors.

A further object of the invention is to provide an improved method for manufacturing silicon gate semiconductor devices, and especially the improved method for making contact holes to both the field effect transistors and its connecting metallization.

Still a further object of the invention is to provide an improved yield for manufacturing large-scaled integrated circuits.

These and other objects are achieved according to the invention by providing a novel method for manufacturing semiconductor integrated circuits such as metal oxide semiconductor field effect transistors having source and drain regions to which contact holes are made such that not only the contact parts of the source and the drain regions, but also both surface parts of a field oxide layer which are adjacent to the outer edges of source and drain regions, are exposed and contacted.

More specifically, the novel method involves forming a field oxide layer on a semiconductor substrate; partially removing the field oxide layer to expose a predetermined part of said semiconductor substrate; forming in the exposed part of the semiconductor substrate insulated gate field effect transistors having insulated gates and source and drain edge regions adjacent to the field oxide layer; forming a first insulating layer which has a different etching rate from the field oxide layer on the overall surface of the field oxide layer and the transistors; forming on the first insulating layer a second insulating layer which has a different etching rate from the first insulating layer; removing portions of the second insulating layer which are situated above the edge part of field oxide layer formed parts of the source and drain regions distant from the gate by using an etching material which substantially only etches the second insulating layer; and etching the first insulating layer by using the second insulating layer as a mask, thus forming contact holes to the integrated circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
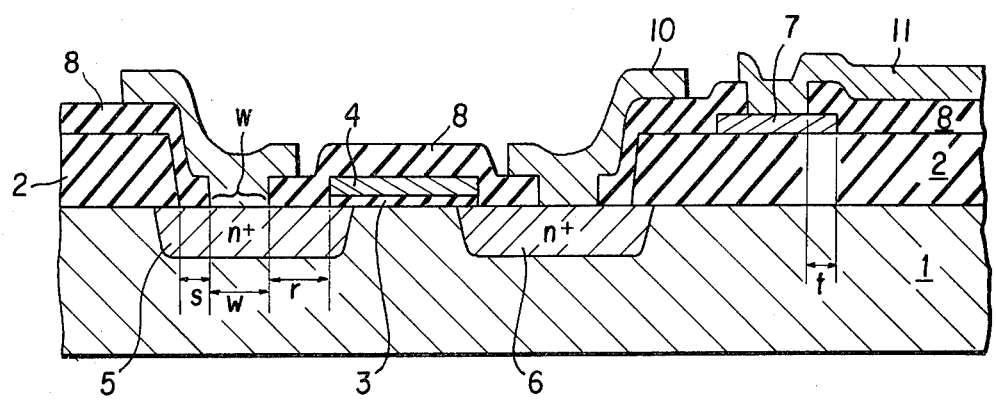
FIG. 1 is a schematic cross-sectional view of the conventional silicon gate MOS transistor.

Referring now to the drawings, wherein like reference numerals designate identical or corresponding parts throughout the several views, and more particularly to FIGS. 2a-2e thereof, one of the suitable embodiments of this invention, for example, a method of manufacturing n-channel silicon gate MOS integrated circuits, is explained. First, on the surface of p-type silicon substrate 21 field oxide layer 22, which has the thickness of about 1 μm, is formed. A predetermined portion of this field oxide 22 is removed to expose a portion of the surface of p-type silicon substrate 21, and in this exposed portion of the p-type silicon substrate 21 polysilicon gate electrode 24 is formed in a predetermined shape. This polysilicon gate electrode 24 is isolated by the offside layer 23 which is relatively thin, say 1000 Å thickness. By using the polysilicon gate electrode 24 and the field oxide layer 22 as a diffusion mask, n-type impurities such as phosphorus are diffused into the p-type silicon substrate 21, thus forming source and drain regions 25 and 26.

Figure 2A:
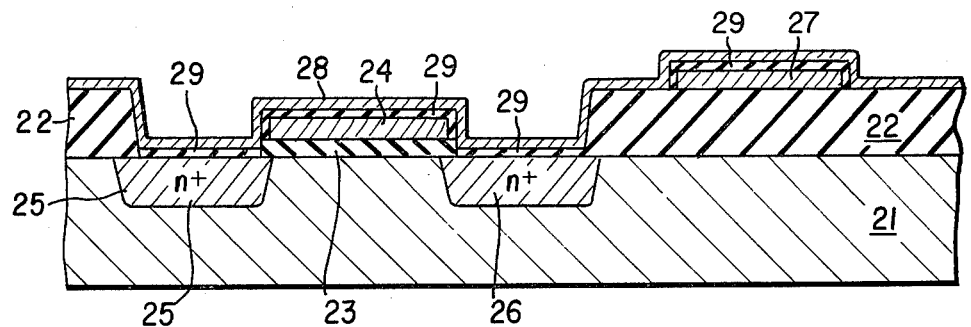
FIGS. 2a to 2e are schematic cross-sectional views of a semiconductor device at each manufacturing step according to the present invention.
Figure 2B:
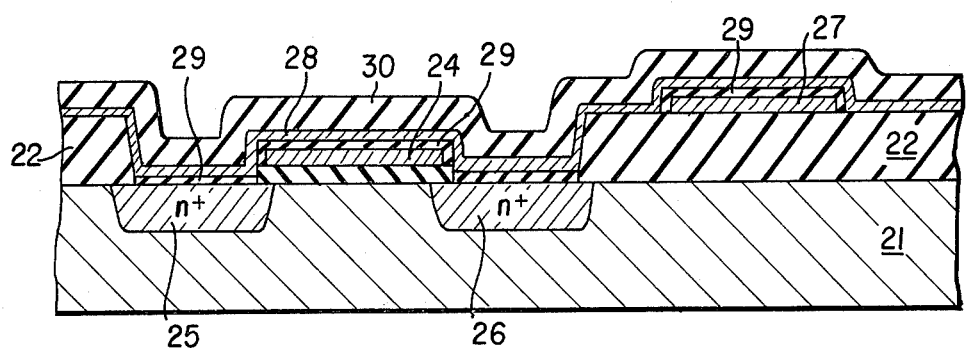

In FIG. 2a, numeral 27 denotes the polysilicon metallization which is formed at a same time as the polysilicon gate electrode 24. In this embodiment, diffusion is done under an oxidizing atmosphere so that on the surface of both source and drain regions 25 and 26 and also the surface of the polysilicon gate electrode 24 is formed a thin thickness of thermal oxide layer 29. The thickness for example is on the order of 1000 Å or less. On the overall surface of the device, silicon nitride layer ($Si_3 N_4$) 28 is formed by using conventional methods. Then, as shown in FIG. 2b, on the overall surface of the silicon nitride layer 28 a CVD (chemical vapor deposition) layer 30 is deposited. Then on top of this CVD layer a photo resist layer 31 is applied, and by using a conventional photo engraving process a predetermined part of the photo resist layer is removed. In the next step, by using a buffered hydrofluoric acid solution, this CVD oxide layer 30 is selectively etched. This is shown in FIG. 2c.

Figure 2C:
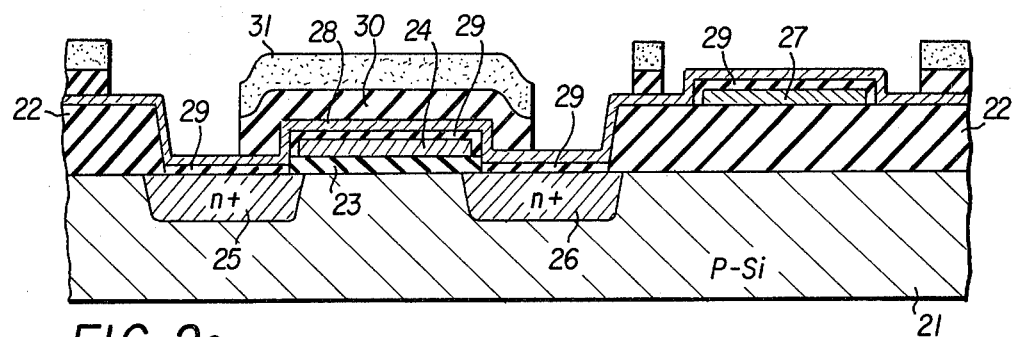

As is shown in FIG. 2c, a contact hole or opening is so made that not only the contact part of source and drain regions but also both surface protions of the field oxide layer 22 which are adjacent to the outer edges of source and drain regions 25 and 26 will be exposed. The size of the contact hole or opening is for example 4 times 4 μm. Also in this embodiment, a bigger hole than the polysilicon connection metallization 27 is made. Etching solution, namely buffered hydrofluoric acid solution, does not practically etch the surface of the edges of the silicon nitride layer 28. So even if the device is subject to this etching solution longer time than is required to etch te CVD layer 30, silicon nitride layer 28 remains unetched. A layer thickness of say 500 Å is adequate for layer 28. Under more precise control this thickness of the silicon nitride layer 28 will be minimized. This silicon nitride layer 28 blocks the etching of field oxide layer 22 and in this emodiment thin oxide layer 29.

In the next step by using freon plasma etching, silicon nitride layer 28 is etched off. In this step, CVD layer 30 serves as a mask for the plasma etching. In this plasma etching, the etching speed for silicon dioxide is very small so that field oxide layer 22 is practically not etched. Also by existence of the oxide layer 29, n+ diffusion layer 25 and 26 or the polysilicon gate electrode 24 and the metallization 27 are not etched by plasma. In this step, thermal oxide layer 29 just functions as a block for plasma etching and a thickness of say 1000 Å is enough. By putting the device in the silicon oxide etching solution for a very short time, the layer 29 is removed. Then, in the last stage as is shown in FIG. 2e, aluminum metallization 32, 33 and 34 which are the connections to the n+ diffusion layer 25, 26 and the metallization 27, respectively, are formed.

Figure 2D:
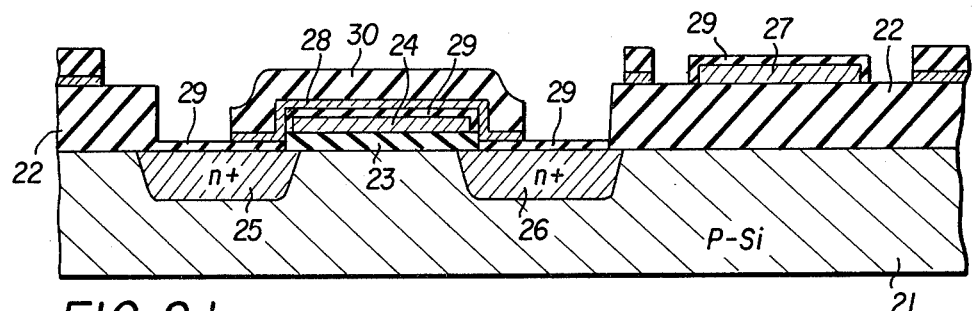
Figure 2E:
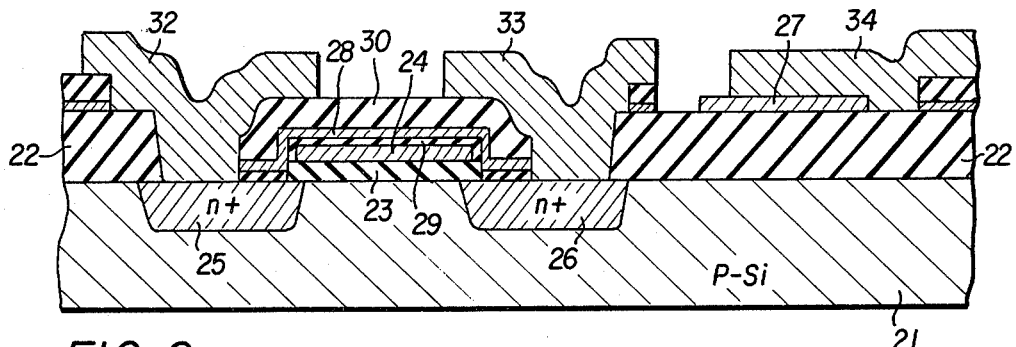

In the above embodiment, as shown in FIG. 2d, block layer 29 is used. If, however, for example hot $H_3PO_4$ solution is used for etching the silicon nitride layer 28, then this block layer 29 is not necessary. So far as the co-relationship in etching between the first layer (in this embodiment silicon nitride layer 28) and the second layer (CVD 30) is maintained the same as the above embodiment. Any suitable etching method for the material will be used in this invention.

In the above embodiment, the invention is described in terms of n-channel MOS integrated circuits, but of course the invention is also applicable to p-channel MOS integrated circuits. According to this invention tolerance for the mask alignment, especially at the edge of the field oxide layer, for one field effect transistor of about several microns is spared. This results in the overall devices about a 10 to 20% diminishing of the chip size. This fact is especially important in the production of large-scale integrated circuits. Also for polysilicon metallization 27, the required tolerance is reduced which enables the minituarization of the polysilicon metallization.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for manufacturing semiconductor integrated circuits, comprising the steps of:
   forming a field oxide layer on a semiconductor substrate;
   partially removing the field oxide layer to expose a predetermined part of said semiconductor substrate;
   forming in said exposed part of the semiconductor substrate insulated gate field effect transistors having insulated gates and source and drain edge regions adjacent to said field oxide layer;
   forming a first insulating layer which has a different etching rate from said field oxide layer on the overall surface of said field oxide layer and said transistors;
   forming on the first insulating layer a second insulating layer which has a different etching rate from said first insulating layer;
   removing portions of said second insulating layer which are situated above the edge part of said field oxide layer and parts of said source and drain regions distant from the gate by using an etching material which substantially only etches said second insulating layer, and
   etching the first insulating layer by using the second insulating layer as a mask, thus forming contact holes to the field effect transistors.

2. A method according to claim 1, further comprising:
   covering the device surface with a thin oxide layer prior to the forming of said first insulating layer; and
   said etching of said first insulating layer comprising plasma etching of said first insulating layer.

3. A method for manufacturing semiconductor integrated circuits according to claim 1 or claim 2, wherein said insulated gates are formed of polysilicon.

4. A method for manufacturing semiconductor integrated circuits according to claim 1, wherein said first and second insulating layers are formed of silicon nitride and thermal silicon oxide, respectively.

5. A method for manufacturing semiconductor integrated circuits according to claim 3 wherein said step of forming said insulated gate further comrises:
   forming a polysilicon metallization on a part of said field oxide layer.

6. A method for manufacturing semiconductor integrated circuits according to claim 5, further comrising:
   forming a contact hole to the polysilicon metallization, said contact hole extending out beyond the polysilicon metallization.

* * * * *